United States Patent
Neff et al.

(10) Patent No.: US 6,788,763 B1
(45) Date of Patent: Sep. 7, 2004

(54) DEVICE FOR PRODUCING AN EXTREME ULTRAVIOLET AND SOFT X RADIATION FROM A GASEOUS DISCHARGE

(75) Inventors: Willi Neff, Kelmis (BE); Rainer Lebert, Kelmis (BE); Klaus Bergmann, Herzogenrath (DE); Oliver Rosier, Juchen (DE)

(73) Assignee: Fraunhofer-Gesellschaft zur Forderung der Angewandten Forschung E.V., Munich (DE)

( * ) Notice: Subject to any disclaimer, the term of this patent is extended or adjusted under 35 U.S.C. 154(b) by 17 days.

(21) Appl. No.: 10/019,475
(22) PCT Filed: Jun. 29, 2000
(86) PCT No.: PCT/EP00/06080
§ 371 (c)(1),
(2), (4) Date: Aug. 9, 2002
(87) PCT Pub. No.: WO01/01736
PCT Pub. Date: Jan. 4, 2001

(30) Foreign Application Priority Data

Jun. 29, 1999 (EP) .............................................. 99112403

(51) Int. Cl.⁷ ................................................ G21G 4/00
(52) U.S. Cl. ......................................... 378/119; 378/34
(58) Field of Search ................ 378/34, 119; 250/493.1, 250/504 R; 315/111.21

(56) References Cited

U.S. PATENT DOCUMENTS

| | | | |
|---|---|---|---|
| 4,771,447 A | 9/1988 | Saitoh et al. | 378/119 |
| 5,175,755 A | 12/1992 | Kumakhov | 378/34 |
| 6,031,241 A * | 2/2000 | Silfvast et al. | 250/504 R |
| 6,654,446 B2 * | 11/2003 | Bender, III | 378/119 |

FOREIGN PATENT DOCUMENTS

| | | |
|---|---|---|
| DE | 2804393 | 6/1982 |
| DE | 19753696 | 6/1999 |
| EP | 0413276 | 6/1991 |
| EP | 0463815 | 1/1992 |
| JP | 01176688 | 7/1989 |
| JP | 02230601 | 9/1990 |

OTHER PUBLICATIONS

Copy of the International Search Report.

* cited by examiner

*Primary Examiner*—David V. Bruce
*Assistant Examiner*—Courtney Thomas
(74) *Attorney, Agent, or Firm*—Crowell & Moring LLP

(57) ABSTRACT

The invention relates to a device for generating extreme ultraviolet and soft x-rays from a gas discharge, operated on the left-hand branch of the Paschen curve. There are two main electrodes, between which there is a gas-filled space, and each main electrode exhibits an opening, by means of which an axis of symmetry [(5)] is defined; and there are means to increase the conversion efficiency. Preferred fields of application are those requiring extreme ultraviolet (EUV) radiation or soft x-rays at a wavelength ranging from approximately 1 to 20 nm, and in particular around 13 nm, such as in EUV lithography.

28 Claims, 5 Drawing Sheets

DEVICE FOR PRODUCING AN EXTREME ULTRAVIOLET AND SOFT X RADIATION FROM A GASEOUS DISCHARGE

BACKGROUND AND SUMMARY OF THE INVENTION

This application claims the priority of EP Patent Document 99112403, filed Jun. 29, 1999, the disclosure of which is expressly incorporated by reference herein.

The invention relates to a device for generating extreme ultraviolet and soft x-rays from a gas discharge. Preferred fields of application are those requiring extreme ultraviolet (EUV) radiation or soft x-rays at a wavelength ranging from approximately 1 to 20 nm, and in particular around 13 nm, such as in EUV lithography.

The German Reference DE 28 04 393 C2 discloses an electrode arrangement for generating and accelerating charged particles, wherein at least one plasma channel is formed in a space between the aligned openings of the electrodes. The charged particles exit the plasma channel and bombard a solid, while emitting electromagnetic radiation. Produced is visible light or x-rays. The drawback with this solution is that the particle accelerator, disclosed in the German Patent DE 28 04 393 C2, requires a decelerating solid, which is subject to wear and which decreases the lifespan of the device. Furthermore, a photon is generated only at approximately every $10^{-4}$ colliding particles so that the efficiency of the radiation generation is low.

The U.S. Pat. No. 4,771,447 teaches the use of an electrode geometry, which is similar to that of the German Patent DE 28 04 393 C2 and wherein the space between the electrodes is evacuated and gas is injected in batches. In this gas puff operation the plasma is generated everywhere between the two electrodes and contracts then into a single radiation-emitting pinched plasma channel. During this gas discharge work is done on the right-hand branch of the Paschen curve. In contrast, an operation on the left-hand branch of the Paschen curve has the advantage that sparking in the gas volume is possible, thus exhibiting especially low wear. Furthermore, operating on the left-hand branch of the Paschen curve permits work without a switching element between the radiation generator and the voltage supply, a feature that enables low inductive and thus very effective coupling of energy into the plasma. The latter enables in turn for time averaged simultaneous energy input smaller pulse energies at higher repetition rates, a feature that also decreases the wear of the electrode arrangement. Depending on the requirements, an operation on the left-hand branch of the Paschen curve also permits work at relatively low gas pressures, a feature that results in low radiation absorption in the gas discharge system. For these reasons the gas puff is less suitable as the source of radiation.

German Patent DE 197 53 696 A1 discloses a generic device. FIG. 1 from German Patent DE 197 53 696 A1 depicts an electrode arrangement with the geometry of a single channel pseudo spark switch and exhibits a cathode (1) and an anode (2) with a gas-filled space (7). Each of the two electrodes (1, 2) exhibits one opening (3, 4), by means of which an axis of symmetry (5) is defined. In the case of this electrode geometry the gas discharge cannot spread on the smallest path between the electrodes, because in this case the average free path length of the charge carrier is greater than the distance between the electrodes. The gas discharge seeks then a longer path, because only in the case of a sufficient discharge distance is an adequately large number of ionizing bursts to maintain the discharge possible. In this case this longer path can be specified by means of the openings (3, 4), by means of which the axis of symmetry (5) is defined. The result is that only a single plasma channel is formed that has the above defined axis of symmetry (5) and whose lateral expansion is determined by the borehole limits. Thus, during this gas discharge the plasma ignites inside the cylinder, defined by the diameter of the openings, on the axis of symmetry (5). Then the plasma contracts onto a cylinder of smaller diameter. Thus, the plasma in DE 197 53 696 A1 is a pinched channel plasma; that is, both in the sparking phase and later after the plasma has contracted there is always plasma whose exterior dimensions represent a channel. This plasma itself is the radiating medium. The radiation is decoupled axially along the axis of symmetry (5) through the openings (3, 4) of the main electrodes.

For commercial reasons, in particular for EUV lithography, an even greater radiation intensity is necessary than is achieved in the solutions known from the prior art. Thus, for example, the plasma channel and thus the electrode spacing can be typically only a few millimeters, thus limiting the intensity of the EUV radiation source. Moreover, in the electrode space the absolutely necessary working gas absorbs a portion of the generated radiation (that cannot be ignored) before it leaves the plasma chamber.

The invention is based on the technical problem of providing a device with a radiation-emitting plasma. With this device it is possible to obtain a particularly high radiation intensity in the EUV range (wavelength approx. $\lambda=10$ to 20 nm) and in the soft x-ray wavelength range (wavelength approx. $\lambda=1$ to 10 nm).

It was recognized, according to the invention, that the aforementioned problems associated with devices for generating extreme ultraviolet and soft x-rays from a gas discharge can be solved by providing two main electrodes, between which there is a gas-filled space; each main electrode exhibits an opening, by means of which an axis of symmetry is defined, and said main electrodes have additionally means to increase the conversion efficiency.

For applications requiring very high emitted output, thus for example EUV lithography, the input electrical power is limited. Therefore, it is also important, how efficiently this input energy is converted into radiant energy, that is, how high the conversion efficiency is. The radiant energy or radiation, which is of interest here, is supposed to be only that that is actually available to the user, thus that that finally leaves the apparatus.

With the means that are described below to increase the conversion efficiency, the output potential of the gas discharge can be better exhausted and higher radiant power can be obtained, as desired. This is primarily guaranteed by an increase in the plasma particle density. With all of these means the radiation intensity is increased, as desired.

According to an advantageous design of the inventive device, at least one auxiliary electrode, which can be positioned in arbitrary ways in the electrode arrangement, can be provided as the means to increase the conversion efficiency.

There is the possibility of positioning the auxiliary electrode(s) behind the openings of the main electrodes, that is on the side of the main electrode openings facing away from the space. Thus, it has proved to be advantageous to position an auxiliary electrode, located at a positive potential, behind the negatively charged main cathode. This wiring causes, first of all, an increase in the sparking field strength or the sparking voltage of the gas discharge. Since it would simultaneously result in more energy coupled into the gas discharge, the sparking voltage is held constant to compensate for this effect. According to Paschen's law, the sparking voltage is a function of the electrode spacing and the gas pressure. Therefore, the sparking voltage is held constant by maintaining a higher gas pressure when the device of the invention is operated on the left branch of the Paschen curve, because usually a higher gas pressure decreases the sparking voltage. However, a higher gas pressure leads to a higher density of plasma particles or there are in total more particles that contribute to the emission of radiation. The increased emission of radiation occurs at the same energy fed into the gas discharge and thus at greater conversion efficiency.

Furthermore, it is possible to position the auxiliary electrodes between the main electrodes. Then the auxiliary electrodes must exhibit an opening on the axis of symmetry, because, after the plasma has contracted, the plasma channel is located on the axis of symmetry. Thus, the space between the main electrodes can be increased. In so doing, the auxiliary electrodes prevent the unwanted sparking of the plasma at the insulators between the main electrodes. Thus, a significantly longer plasma channel of up to a few centimeters in length can be provided, and not just a few millimeters as in DE 197 53 696 A1. Thus, however, when viewed from the axial direction, that is when viewed along the axis of symmetry, a radiation intensity that is higher by a factor of 10 can also be provided.

The reason for the greater radiation intensity with a longer plasma channel lies in a more efficient conversion of energy. The electrode configuration of two main electrodes with one or more auxiliary electrodes located in-between is conceivable as a series connection of two or more simple electrode configurations with an anode, a cathode, and plasma located in-between. In so doing, the energy conversion is a function of the impedance and is optimal when the impedance of the plasma is approximately equal to the impedance of the generator. Since the impedance of a simple electrode arrangement is typically significantly less than that of the generator, the use of several electrodes connected in series results, as desired, in a larger impedance of the plasma. Owing to the better energy conversion, the longer plasma channel contains more radiation-emitting particles, a feature that leads, as desired, to a greater radiation intensity.

A longer radiation-emitting plasma column also has the advantage that under suitable operating conditions, coherent radiation is emitted due to stimulated emission, a feature that has been reported to date only with respect to expensive capillary discharges. For this case there is an x-ray laser, whose emitted radiation intensity scales exponentially with the length of the plasma channel so that an especially high intensity can be obtained.

The openings in the main electrodes can be designed arbitrarily. In the first instance, it is possible that both openings are continuous openings. Thus, the respective opening can be, for example, a continuous hole in the shape of a cylinder that is drilled into the respective electrode. Then the radiation can be decoupled by means of the cathode opening.

Of course, instead of a continuous opening, the anode can exhibit a depression, for example, in the shape of a blind hole. The choice of a depression permits better and/or simpler cooling of the anode. The depression is then not as deep as the electrode is thick. Also for this case there is a preferred direction for forming the gas discharge, since the opening on the opposite side, that is the cathode, provides for the longer electrical field lines. The shape of the depression can be cylindrically symmetrical or also conical. In the case of a depression, instead of a continuous opening, the charge carriers have a shorter path in the area between the electrodes. This feature has the same effect as a smaller electrode spacing. That is, the result is an increase in the sparking field strength or sparking voltage. If the sparking voltage is supposed to be held constant, this feature allows work at higher gas pressures, thus resulting, as desired, in a higher radiation yield. In summary this design of the device provides means to increase the conversion efficiency in a depression, which is chosen instead of a continuous anode opening.

Optionally the anode does not need any opening at all. This case may be regarded as a borderline case of a depression that is as small as possible and by means of which the cooling is optimized and the sparking field strength is maximized.

According to another advantageous design, the main electrodes can be provided with several openings, whereby these openings are arranged symmetrically around the axis of symmetry. In the simplest configuration the openings form a circle, which has its origin or its center on the axis of symmetry of the electrode configuration. This feature makes it possible to specify arbitrarily the starting radius in the sparking phase of the plasma, a feature that is possible only to a very limited degree, for example, in the solution proposed in the German Patent DE 197 53 696 A1. Thus, a larger starting radius brings about, by means of several additional openings, a higher plasma particle density, since, according to the current understanding, only the particles, contained in the volume defined by the starting radius, can be converted into the plasma state. However, a simple enlargement of the central opening on the axis of symmetry is not suitable here, since then it is difficult to conduct tests as a consequence of the sparking of the gas discharge.

Given the presence of several openings in the electrodes, it must be guaranteed that the individual plasma strands are ignited in chronological synchronization, as in the case of a multichannel pseudo spark switch. To this end, an adequately high holding voltage, ranging from a few kilovolts to a few tens of kilovolts, must be applied first to the electrodes. When the voltage is sufficiently high, the universally known gas discharge mechanisms of multiplication of charge carriers cause a gas discharge. The sparking is triggered by injection of charge carriers (plasma or electrons) into the spatial area adjacent to the cathode. In the case of a specified electrode geometry the sparking itself occurs at such a gas pressure that the product of the electrode spacing and gas pressure is on the left branch of the Paschen curve. With the aforementioned auxiliary electrodes behind the openings of the main electrodes, simultaneous sparking of the plasma channels is improved. When several openings that lie opposite each other are present in the main electrodes, individual current lines form, upon simultaneous sparking, between the openings of anode and cathode. Due to the current pulse (the current pulses exhibit typically amplitudes in the two digit kiloamp range) or due to the related self magnetic field, the individual current lines are accelerated onto the axis of symmetry and form there the pinched plasma with the external dimensions of a cylindrically symmetrical channel.

According to another advantageous design, each of the main electrodes can be provided with an individual annular opening. The two main electrodes have, in addition to the opening on the axis of symmetry, an identical circular opening, whose center or origin lies on the axis of symmetry.

According to another advantageous design of the invention, a pulse-forming network can be provided as the current supply in order to increase the conversion efficiency. Namely it has been demonstrated that owing to the plasma dynamic the electric properties of the gas discharge change on a very short time scale of, for example, 10 ns. An optimal plasma dynamic can be realized by tailored current pulses, that is current pulses with a specifically adjustable length, current rise time, shape etc. If only one bank of capacitors is installed as the current supply, then only two parameters, namely the current amplitude and the period duration, can be adjusted with respect to the resulting damped oscillation.

In the case of a pulse-forming network, however, the pulse properties can be adjusted with greater selectively and precision. The resulting improved plasma dynamic leads, as desired, to a better conversion of the electric energy, fed into the gas discharge, into radiant energy, thus to a higher conversion efficiency.

Just as advantageous is the use of a pulse-forming network for the case that the voltage rise time is supposed to be optimized. The voltage rise time is the time required to allow the voltage at the electrodes to rise to the desired value. If the voltage rise time is shorter than the breakthrough time of the gas discharge, thus shorter than the time between applying the voltage and the start of the current flow, the sparking takes place at a voltage that is greater than the sparking voltage. This in turn renders it possible, as in the case of the above-mentioned auxiliary electrodes behind the openings of the main electrodes, to work at a higher gas pressure, a feature that results in a greater radiation intensity.

One possible realization of the pulse-forming network lies in the provision of one or several other capacitors, in addition to the bank of capacitors, by means of which the main electrodes are attached directly. These additional capacitors are attached by means of one or more saturable magnetic switches. With the suitable use of this switch it is possible to couple additional energy into the plasma, for example, just before the buildup phase of the pinched plasma, and thus prior to the radiation emission. Thus, more radiant power can be made available to the user of this source of radiation.

Another measure to increase the conversion efficiency consists of providing at least one additional gas inlet opening, in addition to the gas inlet and gas outlet opening for the working gas in the electrode space. Usually the radiation source for quasi stationary gas flow is operated at pressures of a few Pascal on the left-hand branch of the Paschen curve. The quasi stationary gas flow guarantees that virtually everywhere in the electrode system the same pressure prevails. Owing to the presence of at least one other gas inlet or gas outlet opening, gas can be systematically admitted or pumped out at the relevant points in the electrode system. Thus, it is also possible to provide different gases in different spatial areas of the electrode arrangement. Thus, for example, in the area of the plasma channel on the axis of symmetry there can be one or more gases with high atomic numbers, for example xenon, neon, oxygen or simple room air. When these heavy gases are converted into the plasma state, they form species with electromagnetic transitions in the spectral range of $\boxminus=1$ to 20 nm, which is of interest here. In other spatial areas, and in particular in the spatial area between the plasma channel and the x-ray gate, a light gas, such as helium or deuterium, can be provided. However, the light gases absorb the generated radiation especially poorly so that an especially high radiation intensity is available to the user.

Another advantage of other or additional openings to admit and pump out gases consists of the fact that it is easier to obtain a higher plasma particle density in the plasma channel area. For example, this can occur in that helium is also admixed with the main gas xenon in the area between the central openings on the axis of symmetry of the arrangement. Owing to this homogeneous gas mixture in this spatial area, the sparking voltage can be modified at higher gas density to higher values for the plasma emission.

In another design of the device according to the invention, there are central openings (3, 4) of the main electrodes (1, 2), whose openings on the side facing away from the plasma chamber, are larger than on the side facing the gas-filled space. In this respect it is possible that only one of the two openings is dimensioned in such a manner. The cylindrical symmetry of the pinched plasma channel on the axis of symmetry renders it advantageous for the opening(s) to be also cylindrically symmetrical with the same axis of symmetry.

Therefore, these central electrode openings can be conical or exhibit the shape of a truncated cone, whereby the tip of the truncated cone faces the plasma chamber. With the conical openings, an increase in the conversion efficiency can also be achieved.

The increase in the conversion efficiency due to such a choice of the central electrode openings depends on the fact that it is possible with said openings to decouple more radiation than is possible with a typical cylindrically symmetrical opening. In experiments a cylindrically symmetrical opening with a diameter of 10 mm was chosen, whereby at a specified thickness of the electrodes one could still see as the observer the plasma at an angle of approximately 14 degrees with respect to the axis of symmetry. If a conical opening was chosen in the experiment, one could still recognize the plasma at an angle of 60 degrees. Thus, the result for the same energy fed into the plasma was a decoupled radiation intensity that was larger by approximately a factor of 20 compared to the case of the cylindrically symmetrical opening.

Another advantage of the conical openings lies in the fact that at a constant solid angle they, too, permit the choice of thicker electrodes. Since the electrodes are cooled during the operation, the cooling of thicker electrodes is easier to achieve than with thinner electrodes. The improved cooling in turn allows more energy to be fed in, thus enabling the optimization of the electrode configuration with respect to a higher output.

In another embodiment of the device according to the invention, one or more systems of capillaries for vacuum separation are provided between the gas-filled space (7) and the parts of the device located in the ultra high vacuum (UHV). Owing to their length, which is longer than their diameter, the capillaries exhibit a high current resistance to gases so that a greater drop in pressure can be achieved. Therefore, by means of the capillaries an especially high ultra high vacuum can be created, thus reducing the radiation absorption in these parts of the device. When the same energy is coupled into the system, it results, as desired, in a greater radiation intensity for the respective application.

One possible realization for a system of capillaries is the micro channel plate 33. Micro channel plates exhibit hollow channels, through which the radiation can pass from the space (7) into the UHV area (19) and from there to the application. Even thin micro channel plates are very stable and show a high transmission for the generated EUV radiation. Thus, depending on the geometry of the electrode system, the micro channel plate can be designed as a cylinder-shaped disk. Channels with diameters in the one to two digit micrometer range penetrate the micro channel plates. Thus, it is possible, for example, to choose micro channel plates with thicknesses in the one digit millimeter range; and at least 50%, preferably at least 70%, of their surfaces comprises the openings of the micro channels.

It is also possible to select a geometrical-spatial configuration of the capillaries, with which the radiation from the plasma source can be collected, shaped and coupled suitably into the optical system of the respective application. One example of such a system is the Kumakhov lens.

The radiation source of the invention shall be explained below with reference to the embodiments.

DETAILED DESCRIPTION OF THE DRAWINGS

Figure 1:
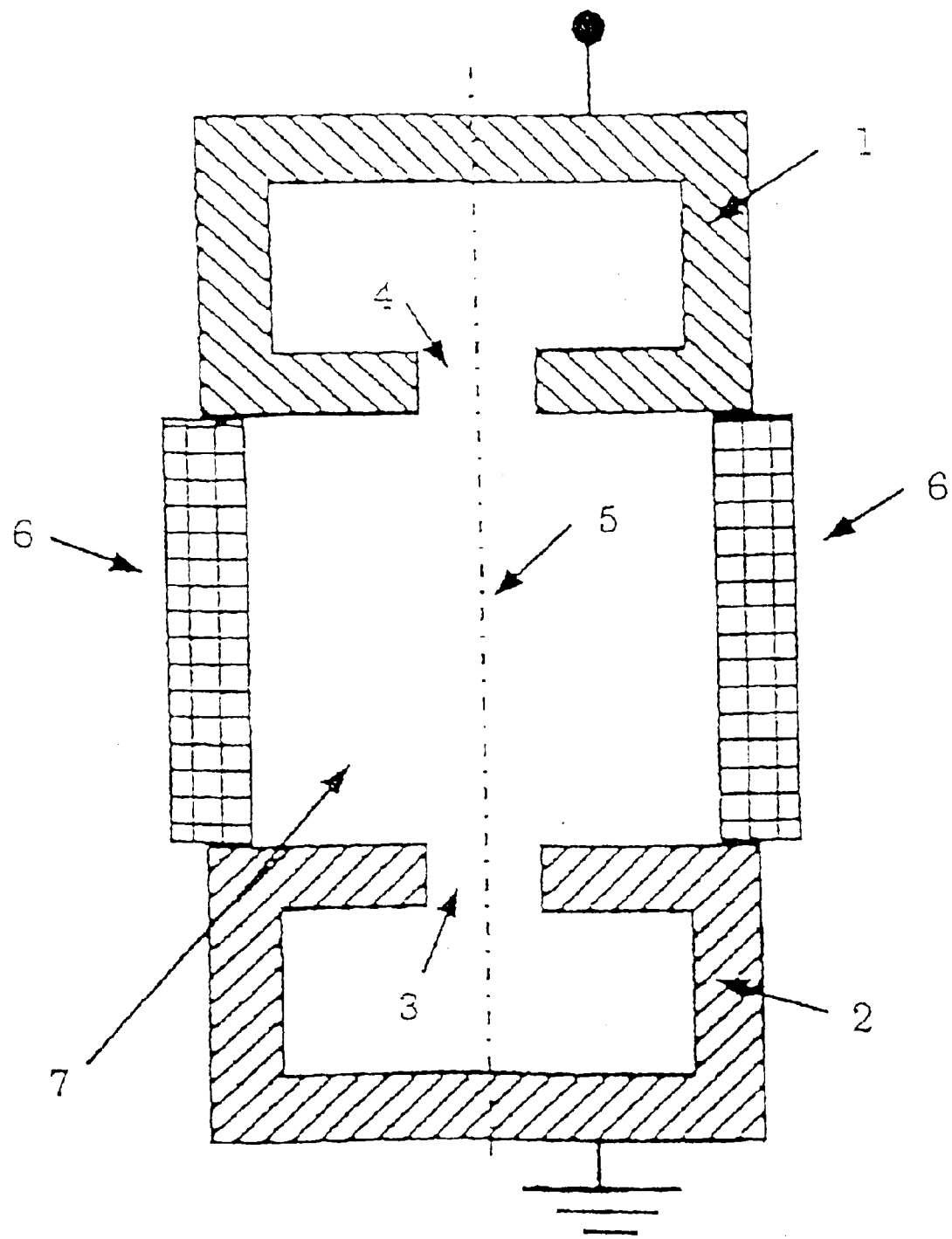
FIG. 1 depicts an electrode geometry according to the prior art.
Figure 2:
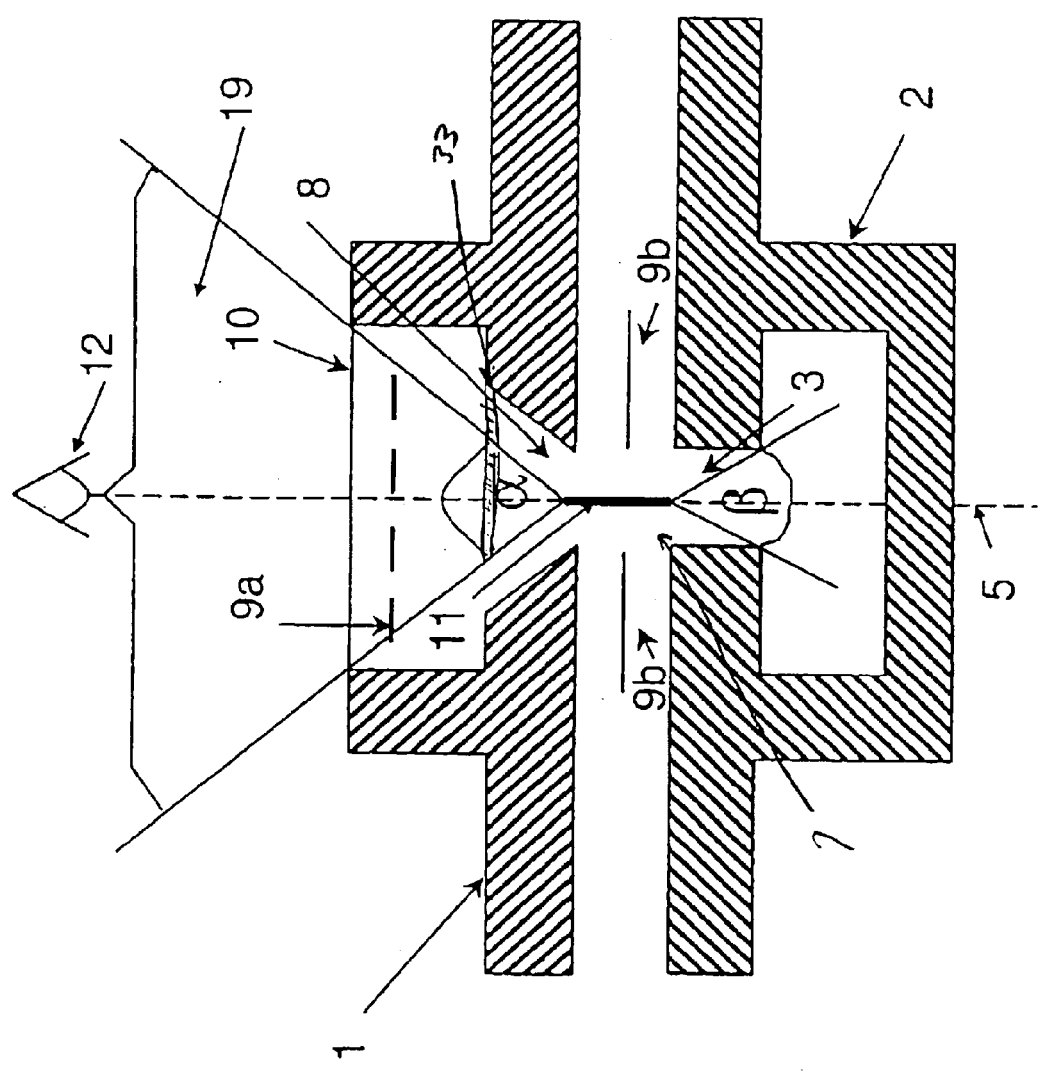
FIG. 2 depicts an electrode configuration with auxiliary electrodes.

FIG. 2 depicts the inventive device with additional auxiliary electrodes (9a, 9b) to increase the conversion efficiency or the radiation yield. A radiation emitting pinched plasma (11) forms in the gas-filled space (7) between the electrodes (1, 2), to which voltage is applied. On the side of the cathode (1) facing away from the space (7) there is an auxiliary electrode (9a), by means of which the sparking field strength of the gas discharge can be increased. This in turn allows an operation at higher gas pressures at higher radiation yield. The auxiliary electrode (9a) exhibits in operation a positive potential with respect to the cathode (1). Furthermore, between the main electrodes there is an auxiliary electrode (9b) to provide a longer pinched plasma column (11).

Studies have shown that the plasma column (11) does not project or projects only slightly into the openings (3, 8) of the main electrodes, and thus in the case of a cylindrically symmetrical design of the openings only a small solid angle is available for the radiation decoupling. Thus, the cylindrically symmetrical opening (3) in this embodiment exhibits a diameter of 10 mm, with which, given the specified thickness of the electrodes, an observer could still see the plasma at an angle of $\theta = \alpha = 14$ degrees relative to the axis of symmetry (5). Therefore, to increase the radiation yield the opening (8) is designed conically. In the case of the conical opening (8) the plasma (11) can still be recognized by the observer (12) at an angle of $\theta = \alpha = 60$ degrees relative to the axis of symmetry (5). Thus, when the same energy is fed into the plasma, the result is a decoupled radiation intensity, which, compared to the case of the cylindrically symmetrical opening, is larger by approximately a factor of 20.

Figure 3:
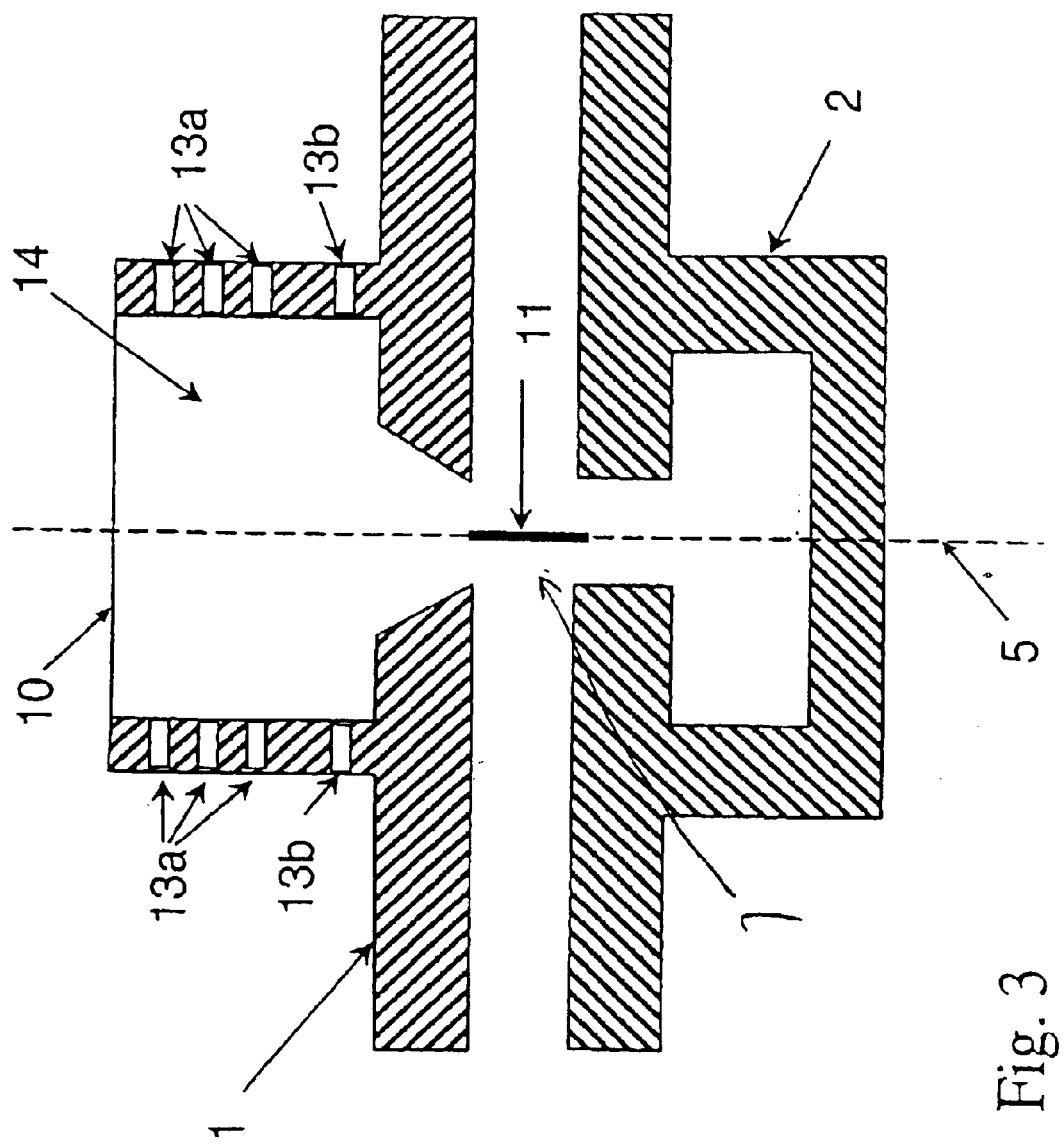
FIG. 3 depicts an electrode configuration with additional gas inlet openings.

FIG. 3 depicts in principle the same electrode configuration as in FIG. 2, but without the auxiliary electrodes. In addition, there are auxiliary openings (13a, 13b) for the gas inlet and/or the gas outlet from the area (14) of the hollow cathode (1). Thus, the discharge gas, such as xenon, oxygen or $SF_6$, which is required for the gas discharge, can be admitted through the openings (13b). Said gas is ignited in the space (7). In the rearward areas of the electrode system, which are illustrated in FIG. 3, there is a gas with slight absorption, like helium or hydrogen. This gas, which is transparent to the generated radiation, is admitted through the openings (13a) into the area (14). The openings (13a) for admitting the transparent gas are farther away from the opening (8) than the openings (13b) for admitting the discharge gas. Thus, the light gas is first in that part of the area (14) of the cathode (1) that faces the x-ray gate (10); and the heavier discharge gas is in that part of the area (14) that faces away from the protecting glass (10) or in the vicinity of the opening (8).

At this stage this procedure has two possibilities. First, both gases can be siphoned off in such a manner through openings, which are not shown in FIG. 3, in the area of the gas-filled space (7) that the result is a thorough mixing of both types of gases. The advantage lies in the fact that a higher plasma particle density can be obtained in the plasma channel located in the electrode space (7). As an alternative a part of the openings (13a) can be used in such a manner by initiating a laminar flow of the light gas in the rearward areas of the electrode system that thorough mixing is largely avoided by siphoning off the light gas. Thus, the light gas remains permanently in that part of the area (14) that faces the x-ray gate (10). However, this light gas absorbs the radiation significantly less than the discharge gas so that a higher radiant power is available to the user.

Another possibility for using the openings (13a, 13b) consists of admitting the discharge gas not through the openings (13b), but rather through the openings, which are not shown in FIG. 3, in the area of the gas-filled space (7) or the anode (2) and siphoning off through the openings (13b). The light gas or transparent gas is admitted in turn through the openings (13a). These designs show that the openings (13a) can be used both to admit and to discharge the discharge gas(es); and the openings (13a) can be used only to admit the light gas(es).

Figure 4:
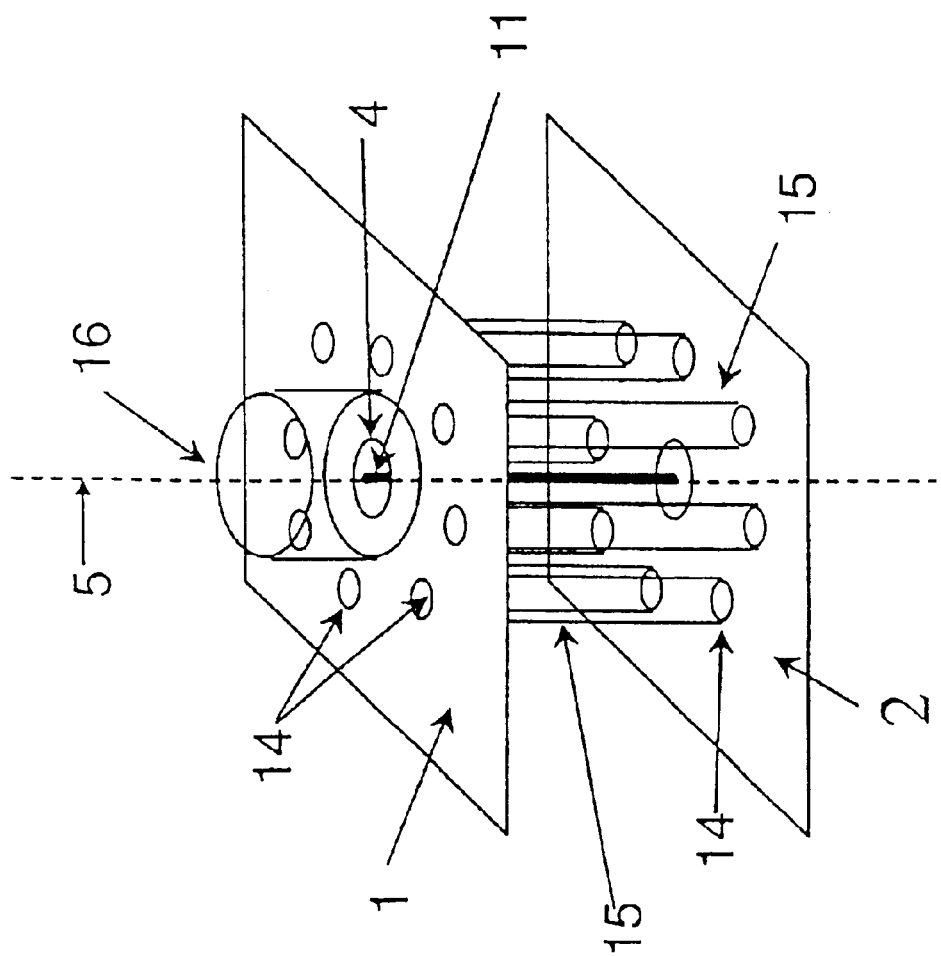
FIG. 4 depicts an electrode configuration with additional openings.

FIG. 4 depicts an embodiment of the inventive device, wherein the electrodes (1, 2) exhibit additional circular openings (14). The openings (14) are circular inside the respective electrode and are arranged equidistant in relation to the circle. Anode (1) and cathode (2) exhibit the same number of identical openings in the same geometric arrangement with respect to the axis of symmetry (5). When viewed along the axis of symmetry (5) in the direction of every opening (4) in the anode (2), the result of this design is an opening, located behind it, in the cathode (1). When a voltage is applied to the electrodes, the result is a formation of several plasma lines (15) in the sparking phase of the gas discharge. The plasma lines (15) contract subsequently into a single central radiation-emitting pinched plasma channel (11) on the axis of symmetry (5) owing to the self magnetic field of the flowing electrical current. The radiation is decoupled axially along the axis of symmetry (5). If the electrode facing the x-ray gate is the cathode (1), then it is advantageous to provide a shield (16) between the central opening (4) and the additional openings (14). The shield (16) has the advantage that the sparking that occurs only in the channels of the thin plasma lines (15), but not in the central channel along the axis of symmetry (5), is facilitated. The shield (16) can be omitted, if the electrode facing the x-ray gate (10) is the anode (2), since sparking takes place only on the cathode side.

Figure 5:
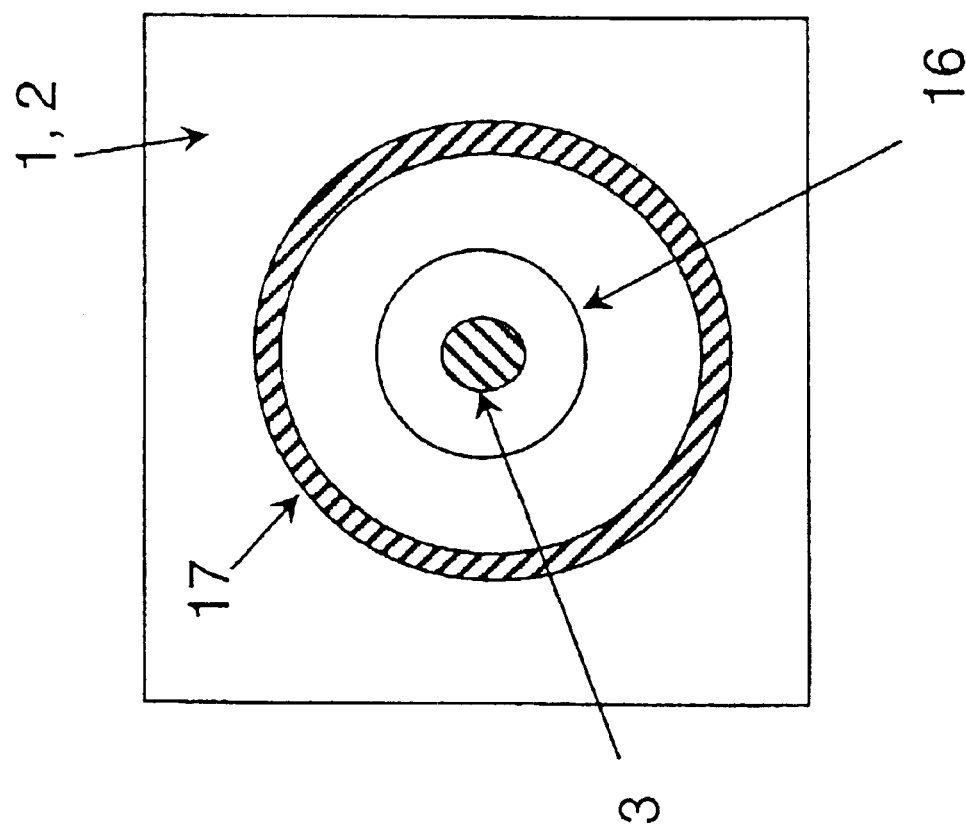
FIG. 5 depicts the electrodes with ring-shaped additional opening.

FIG. 5 is a view of an electrode with a central opening (3), which additionally exhibits a ring-shaped opening (17). The ring-shaped opening (17) exhibits a center or an axis of symmetry, which coincides with the axis of symmetry (5) of the electrode configuration. An electrode, which faces the x-ray gate (10) and belongs to this design, requires, as in the embodiment according to FIG. 4, an additional shield (16).

List of Reference Numerals

1: cathode
2: anode
3, 4: (main) opening
5: axis of symmetry
6: insulator as the space holder
7: gas-filled space
8: conically designed opening
9*a*: auxiliary electrode behind the opening of the main electrode
9*b*: auxiliary electrode between the main electrodes
10: x-ray gate
11: pinched plasma
12: observer
13*a*, 13*b*: gas inlet and/or gas outlet opening
14: additional opening in the electrode
15: plasma lines
16: shield
17: ring-shaped opening
19: ultra high vacuum (UHV) area of the device

What is claimed is:

1. A device for generating extreme ultraviolet and soft x-rays from a gas discharge, operated on the left-hand branch of the Paschen curve, comprising:

two main electrodes, between which there is a gas-filled space, wherein each of said two main electrodes exhibits an opening, defining an axis of symmetry, and wherein the electrodes are formed in such a manner that the gas discharge forms exclusively in the volume, determined by an alignment of the openings; and where the plasma channel, generated on the axis of symmetry, is the source for at least one of the extreme ultraviolet and x-rays, and a means for increasing conversion efficiency including an auxiliary electrode provided behind the opening of one of the main electrodes.

2. The device as claimed in claim 1, wherein at least one of the openings on the side facing away from the space is larger than on the side facing the space.

3. The device as claimed in claim 2, wherein the openings exhibit the shape of a truncated cone.

4. The device as claimed in claim 1, wherein the anode opening is designed as a non-continuous depression, and in particular as a blind hole.

5. The device as claimed in claim 1, wherein each of said main electrodes has a ring-shaped opening, whereby the center of the ring lies on the axis of symmetry.

6. The device as claimed in claim 1, wherein a pulse-forming network is provided as a power supply.

7. The device as claimed in claim 1, wherein, in addition to the gas inlet and outlet opening for the working gas in the electrode space, there is at least one additional gas inlet or gas outlet opening.

8. The device as claimed in claim 1, further comprising a system of capillaries, for vacuum separation, provided between the gas-filled space and highly evacuated areas of the device.

9. The device as claimed in claim 8, wherein the system of capillaries is a micro channel plate or a Kumakhov lens.

10. A device for generating extreme ultraviolet and soft x-rays from a gas discharge, operated on the left-hand branch of the Paschen curve, comprising:

two main electrodes, between which there is a gas-filled space, wherein each of said two main electrodes exhibits an opening, defining an axis of symmetry, and wherein the electrodes are formed in such a manner that the gas discharge forms exclusively in the volume, determined by an alignment of the openings; and where the plasma channel, generated on the axis of symmetry, is the source for at least one of the extreme ultraviolet and x-rays, and a means for increasing conversion energy including an auxiliary electrode, which exhibits an opening on the axis of symmetry, provided between the main electrodes.

11. The device as claimed in claim 10, wherein at least one of the openings on the side facing away from the space is larger than on the side facing the space.

12. The device as claimed in claim 11, wherein the openings exhibit the shape of a truncated cone.

13. The device as claimed in claim 10, wherein the anode opening is designed as a non-continuous depression, and in particular as a blind hole.

14. The device as claimed in claim 10, wherein each of said main electrodes has a ring-shaped opening, whereby the center of the ring lies on the axis of symmetry.

15. The device as claimed in claim 10, wherein a pulse-forming network is provided as a power supply.

16. The device as claimed in claim 10, wherein, in addition to the gas inlet and outlet opening for the working gas in the electrode space, there is at least one additional gas inlet or gas outlet opening.

17. The device as claimed in claim 10, further comprising a system of capillaries, for vacuum separation, provided between the gas-filled space and highly evacuated areas of the device.

18. The device as claimed in claim 17, wherein the system of capillaries is a micro channel plate or a Kumakhov lens.

19. A device for generating extreme ultraviolet and soft x-rays from a gas discharge, operated on the left-hand branch of the Paschen curve, comprising:

two main electrodes, between which there is a gas-filled space, wherein each of said two main electrodes exhibits an opening, defining an axis of symmetry, and wherein the electrodes are formed in such a manner that the gas discharge forms exclusively in the volume, determined by an alignment of the openings: and where the plasma channel, generated on the axis of symmetry, is the source for at least one of the extreme ultraviolet and x-rays, wherein each of said main electrodes has a plurality of openings.

20. The device as claimed in claim 19, wherein the openings in the main electrodes are arranged on a circle, through whose center runs the axis of symmetry.

21. The device as claimed in claim 19, wherein at least one of the openings on the side facing away from the space is larger than on the side facing the space.

22. The device as claimed in claim 21, wherein the openings exhibit the shape of a truncated cone.

23. The device as claimed in claim 19, wherein the anode opening is designed as a non-continuous depression, and in particular as a blind hole.

24. The device as claimed in claim 19, wherein each of said main electrodes has a ring-shaped opening, whereby the center of the ring lies on the axis of symmetry.

25. The device as claimed in claim 19, wherein a pulse-forming network is provided as a power supply.

26. The device as claimed in claim 19, wherein, in addition to the gas inlet and outlet opening for the working gas in the electrode space, there is at least one additional gas inlet or gas outlet opening.

27. The device as claimed in claim 19, further comprising a system of capillaries, for vacuum separation, provided between the gas-filled space and highly evacuated areas of the device.

28. The device as claimed in claim 27, wherein the system of capillaries is a micro channel plate or a Kumakhov lens.

* * * * *